United States Patent
Aratani et al.

[11] Patent Number: 5,961,944
[45] Date of Patent: Oct. 5, 1999

[54] PROCESS AND APPARATUS FOR MANUFACTURING POLYCRYSTALLINE SILICON, AND PROCESS FOR MANUFACTURING SILICON WAFER FOR SOLAR CELL

[75] Inventors: Fukuo Aratani; Yoshiei Kato; Yasuhiko Sakaguchi; Noriyoshi Yuge; Hiroyuki Baba; Naomichi Nakamura; Kazuhiro Hanazawa, all of Chiba, Japan

[73] Assignee: Kawasaki Steel Corporation, Japan

[21] Appl. No.: 08/894,030

[22] PCT Filed: Oct. 14, 1996

[86] PCT No.: PCT/JP96/02965

§ 371 Date: Aug. 8, 1997

§ 102(e) Date: Aug. 8, 1997

[87] PCT Pub. No.: WO98/16466

PCT Pub. Date: Apr. 23, 1998

[51] Int. Cl.$^6$ .................................................. C01B 33/02
[52] U.S. Cl. ........................ 423/348; 423/349; 164/512; 164/122.1; 425/447
[58] Field of Search ................................ 423/348, 349, 423/350; 117/905; 164/512, 122.1, 338.1, 494; 425/256, 447

[56] References Cited

U.S. PATENT DOCUMENTS

| | | | |
|---|---|---|---|
| 3,012,865 | 12/1961 | Pellin | 423/348 |
| 3,658,119 | 4/1972 | Hunt et al. | 164/512 |
| 4,097,584 | 6/1978 | Reuschel et al. | 423/348 |
| 4,193,974 | 3/1980 | Kotral et al. | 423/348 |
| 4,312,847 | 1/1982 | Dawless | 423/348 |
| 5,254,300 | 10/1993 | Priewasser et al. | 264/40.4 |
| 5,510,095 | 4/1996 | Aratami et al. | 423/438 |

FOREIGN PATENT DOCUMENTS

| | | | |
|---|---|---|---|
| 0 459 421 | 12/1991 | European Pat. Off. | 423/348 |
| 29 24 584 | 1/1981 | Germany | 423/348 |
| 32 20 285 | 12/1983 | Germany | 423/348 |
| 61-141612 | 6/1986 | Japan . | |
| 62-252393 | 11/1987 | Japan . | |
| 63-218506 | 9/1988 | Japan . | |
| 4-193706 | 7/1992 | Japan | 423/348 |
| 4-228414 | 8/1992 | Japan | 423/348 |
| 4-342496 | 11/1992 | Japan | 423/348 |
| 5-139713 | 6/1993 | Japan . | |
| 6-227808 | 8/1994 | Japan | 423/348 |
| 7-17704 | 1/1995 | Japan . | |
| 8-217436 | 8/1996 | Japan . | |

Primary Examiner—Ngoc-Yen Nguyen
Attorney, Agent, or Firm—Austin R. Miller

[57] ABSTRACT

An object of the present invention is to provide a process and apparatus for the continuous flow production of polycrystalline silicon from metallic silicon or silicon oxide as a raw material and also for the manufacture of a wafer by using it, which process and apparatus permit the mass production at a low cost. The above object can be attained by the manufacture of polycrystalline silicon and a silicon wafer for a solar cell by the following steps: (A) smelting metallic silicon under reduced pressure, carrying out solidification for the removal of the impurity components from the melt, thereby obtaining a first ingot, (B) removing the impurity concentrated portion from the ingot by cutting, (C) re-melting the remaining portion, removing boron and carbon from the melt by oxidizing under an oxidizing atmosphere, and blowing a mixed gas of argon and water to carry out deoxidization, (D) casting the deoxidized melt into a mold, and carried out directional solidification to obtain a second ingot, and (E) removing the impurity concentrated portion of the ingot obtained by directional solidification by cutting.

20 Claims, 5 Drawing Sheets

PROCESS AND APPARATUS FOR MANUFACTURING POLYCRYSTALLINE SILICON, AND PROCESS FOR MANUFACTURING SILICON WAFER FOR SOLAR CELL

BACKGROUND OF THE INVENTION

1. Field of the Invention

This invention relates to a process and apparatus for manufacturing polycrystalline silicon and a process for manufacturing a silicon wafer for a solar cell. In particular, this invention pertains to a technique which employs metallic silicon or silicon oxide as a starting material and permits the continuous flow production from polycrystalline silicon to an end product, that is, a polycrystalline silicon wafer for a solar cell.

2. Description of the Related Art

Studies on solar cells have been made for many years. Recently, those having a photoelectric transfer efficiency of even about 13 to 15% under sun light on the ground have appeared and they are now being industrialized for various applications. In our country, however, solar cells are not so popular as an energy source for domestic electric power, automobiles, ships or machine tools, because a technique to mass-produce a silicon wafer at a low cost, which is necessary for the manufacture of solar cells, has not yet been established.

At present, for the manufacture of a silicon wafer for a solar cell, a high-purity silicon, which is in the mass form and conforms to the specification of a semiconductor, is once manufactured through a chemical process by using as a starting material a low purity metallic silicon (99.5 wt. % Si). Then, high-purity silicon in the mass form is re-melted and is adjusted to have a chemical composition suited to a solar cell by a metallurgical process. The resulting molten silicon is formed into an ingot by the pulling method or directional solidification method, followed by slicing into thin plates. Described specifically, as shown in FIG. 5, metallic silicon is first reacted with hydrochloric acid and formed into a trichlorosilane gas. After the gas so obtained is fractionated to remove the impurity elements, the residue is reacted with a hydrogen gas, whereby high-purity silicon is precipitated from the gas by the so-called CVD (Chemical Vapor Deposition) method. The high-purity silicon therefore becomes only an aggregate of silicon grains owing to the weak bonding power between crystal grains. The boron contained in the high-purity silicon forming the aggregate is reduced even in the order of 0.001 ppm and does not reach the concentration necessary for satisfying the specific resistivity of 0.5 to 1.5 ohm.cm which is the specification for P-type semiconductor wafer. In order to use the above high-purity silicon for a solar cell, it is indispensable to adjust the specific resistivity and to control the crystallinity of single crystals or crystal grains so as to have a particle size not smaller than several mm and have a grain boundary so as not to exert adverse effects on the photoelectric transfer efficiency. The above silicon cannot be formed into a wafer without further treatment. As shown in the right hand of FIG. 5, it becomes necessary to form a wafer after re-melting the high-purity silicon mass, adjusting the components of the melt (by the addition of boron) and forming into an ingot (pulling method for single crystals, while directional solidification for polycrystals).

The above-described manufacturing method is however accompanied with the drawbacks that it requires much labor to re-adjust (mainly, by the addition of boron) the components of a silicon ingot, which has a purity intentionally heightened to be suitable for semiconductor, to be suitable for solar cells or to purify the ingot; its yield is inferior; it additionally requires equipment and energy for re-melting; and therefore, it is expensive. As described above, the solar cells available now are therefore expensive, which prevents them from being popularly used. The purity heightening of metallic silicon by a chemical process is also accompanied by the generation of a large amount of pollutants such as silane and chloride, which prevents mass-production. According to the above described technique, the manufacturing process tends to be studied, divided into steps such as increasing the purity of metallic silicon, or using the solidification technique, which is presumed to be influenced by the above-described manufacturing method.

For example, Japanese Published Unexamined Patent Application No. HEI 5-139713 discloses a process in which silicon having a low boron content is obtained by maintaining molten silicon in a container composed of silica or composed mainly of silica, and injecting a plasma gas jet flow of an inert gas to the surface of the molten silicon, while blowing an inert gas upwardly from the bottom of the container. Japanese Published Unexamined Patent Application No. HEI 7-17704 discloses a process permitting the efficient removal of boron by forming 1.5 to 15 kg of $SiO_2$ per kg silicon in advance on the surface of metallic silicon powders upon melting metallic silicon through an electron beam. Concerning solidification technique, Japanese Published Unexamined Patent Application No. SHO 61-141612 proposes a technique to prevent, upon casting molten silicon into a mold, precipitation of inclusion in a silicon ingot by turning the mold. In addition, the present applicants themselves are now proposing a method for purifying molten metallic silicon by directional solidification in Japanese Patent Application HEI 7-29500 (filed on Feb. 17, 1995).

It is impossible to say that there does not exist a technique to manufacture solar cell silicon directly from metallic silicon. For example, Japanese Published Unexamined Patent Application No. SHO 62-252393 discloses a process in which a starting material silicon, which is once used as a semiconductor but disposed as an electron industry waste, is subjected to zone melting by plasma jet generated by a mixed gas of argon, hydrogen and oxygen. This process aims principally at the use of an industrial waste so that it does not become a mainly-employed technique suited for mass production of a silicon wafer. In addition, although silicon is used as a raw material, its purity has been once increased so that the process is only a variation of the above-described cumbersome manufacturing process. Japanese Published Unexamined Patent Application No. SHO 63-218506 discloses a process for manufacturing, by plasma melting, silicon in the mass form for solar cells or electronics from metallic silicon in the form of powders, granules or polished dusts. This method is based on the principle of the zone melting method using the same plasma as that disclosed in the above Japanese Published Unexamined Patent Application No. SHO 62-252393 and is accompanied with the drawback that mass production cannot be carried out in spite of large electricity consumption. According to Examples of the above official gazette, only a silicon rod of 50 g or so is obtained on a laboratory scale and it does not include a description of increasing the size of the silicon wafer for a solar cell to a practical size.

SUMMARY OF THE INVENTION

With the forgoing in view, an object of the present invention is to provide a process and apparatus for mass-producing, at a low cost in continuous flow production, polycrystalline silicon by using metallic silicon or silicon oxide as a starting raw material, and a wafer manufactured using the process.

With a view to attaining the above object, the inventors of the present invention have carried out an extensive investigation, paying attention to obtaining the maximum economic effects without using a chemical process but only a metallurgical process, leading to the completion of the present invention.

In a first aspect of the present invention, there is thus provided a process for manufacturing polycrystalline silicon from metallic silicon, which comprises the following steps:

A: melting metallic silicon under vacuum to remove the phosphorus contained therein by evaporation, and then carrying out solidification of the residue for the removal of the impurity elements from the molten silicon (which may hereinafter be called "melt"), thereby obtaining a first ingot;

B: removing the impurity concentrated portion of the first ingot by cutting;

C: re-melting the remaining portion, removing boron and carbon from the melt by oxidizing under an oxidizing atmosphere, and in succession, blowing an argon gas or a mixed gas of argon and hydrogen into the melt for deoxidization.

D: casting the deoxidized melt in a mold, followed by directional solidification to obtain a second ingot; and E: removing the impurity concentrated portion of the second ingot by cutting.

In a further aspect of the present invention, there is also provided a process for the preparation of polycrystalline silicon, wherein in the above-described process, said metallic silicon is obtained by reductive smelting of silicon oxide.

In a still further aspect of the present invention, there is also provided a process for the preparation of polycrystalline silicon, which comprises transferring said metallic silicon under molten state, which has been obtained by smelting of silicon oxide in the above-described process, into a crucible, removing boron and carbon from it by oxidizing under an oxidizing atmosphere, and carrying out solidification, followed by the above-described step B, melting under vacuum, and the above-described steps D and E.

In a still further aspect of the present invention, there is also provided a process for the preparation of polycrystalline silicon, which comprises forming the above-described oxidizing atmosphere from an $H_2O$, $CO_2$ or $O_2$ gas in an amount small enough so that the whole interface between the melt and the gas will not be covered with silicon oxide, removing silicon oxide formed on the surface of the melt by locally heating by plasma arc, or blowing an $H_2O$, $CO_2$ or $O_2$ gas into the melt instead of placing the melt under the above-described oxidizing atmosphere.

In a still further aspect of the present invention, there is also provided a process for the preparation of polycrystalline silicon, which comprises using $SiO_2$ or $Si_3N_4$ as a mold releasing agent, setting a solidification interface moving rate at 5 mm/min or less, said solidification being carried out for the removal of impurities, setting a solidification interface moving rate at 2 mm/min or less for directional solidification, or cutting the ingot at a height at least 70% above the bottom of the ingot.

In a still further aspect of the present invention, there is also provided a process for the preparation of polycrystalline silicon which comprises setting a phosphorus concentration of the melt at 0.3 ppm or less and a boron concentration at 0.6 ppm or less or a carbon concentration at 10 ppm or less.

The present invention also relates to an apparatus for manufacturing polycrystalline silicon. In a still further aspect of the present invention, there is also provided an apparatus for manufacturing polycrystalline silicon, which comprises heating means for melting or heating metallic silicon, a retaining container for retaining molten metallic silicon, a first mold in which the melt is cast from the retaining container, a vacuum chamber for removing phosphorus by evaporation, said chamber surrounding the retaining container and the first mold, re-melting means for re-melting or heating a portion of the ingot from the first mold, a smelting container for retaining the re-melt, a nozzle for blowing or spraying an oxidizing gas, hydrogen gas or a mixed gas of hydrogen and argon to the re-melt in the smelting container and a second mold for forming the deoxidized re-melt into a cast ingot.

In a still further aspect of the present invention, there is also provided an apparatus for manufacturing polycrystalline silicon, wherein the degree of vacuum in the above-described vacuum chamber is set at 10–3 torr or higher, the retaining container is a water-cooling jacket made of copper or a graphite crucible; and the smelting container is a crucible made of $SiO_2$, an $SiO_2$ stamped crucible or an $SiO_2$ lined crucible.

In a still further aspect of the present invention, there is also provided an apparatus for manufacturing polycrystalline, wherein the above-described heating means is an electron gun; or the above-described re-melting means is a plasma torch or a DC arc source.

In a still further aspect of the present invention, there is also provided an apparatus for the preparation of polycrystalline silicon, wherein the above-described first and second molds have side walls formed of a heat insulating material and have a bottom formed of a water cooling jacket; and a heating source for heating the cast melt is disposed above the molds; or a W/H ratio, that is, the ratio of the diameter W to the height H of said mold is set at greater than 0.5.

In a still further and essential aspect of the present invention, there is thus provided a process for the manufacture of a silicon wafer for a solar cell, which comprises slicing an ingot of polycrystalline silicon, which has been obtained by any one of the above-described processes, to a thickness of 100 to 450 μm.

According to the present invention, polycrystalline silicon or a silicon wafer for a solar cell is manufactured by any one of the above-described methods or apparatuses so that the component adjustment of high-purity silicon, which is indispensable in the conventional method, is not required. The present invention also makes it possible to reduce the unnecessary consumption of energy. Since not a chemical process which is characterized by the generation of a large amount of pollutants but only a metallurgical process is adopted, the present invention makes it possible to enlarge the production equipment. As a result, a silicon wafer for a solar cell having excellent photoelectric transfer efficiency can be provided at a cost by far lower than the conventional one. Furthermore, polycrystalline silicon obtained by the enforcement of the present invention can be used effectively not only for the manufacture of a wafer but also for the use as a raw material for iron manufacture or the like.

As described above, the present invention makes it possible to avoid the consumption of unnecessary energy and enlarge the manufacturing equipment, thereby mass-producing polycrystalline silicon or polysilicon wafer for a solar cell having relatively good purity. As a result, a polycrystalline silicon wafer for a solar cell which has a photoelectric transfer efficiency on the ground on the same level with that obtained in the conventional method can be obtained at a markedly low cost, from which the wide diffusion of solar cells are much expected. Polycrystalline silicon can be used effectively as a raw material for iron manufacture as well as that for a wafer.

According to the present invention, high-purity polycrystalline silicon and a silicon wafer for a solar cell can be manufactured through a continuous flow production based on only a metallurgical process. Accordingly, the equipment can be enlarged freely and unnecessary energy can be omitted. The present invention is therefore very useful for the manufacture of a silicon wafer for a solar cell.

DETAILED DESCRIPTION OF THE PREFERRED EMBODIMENTS

Figure 1:
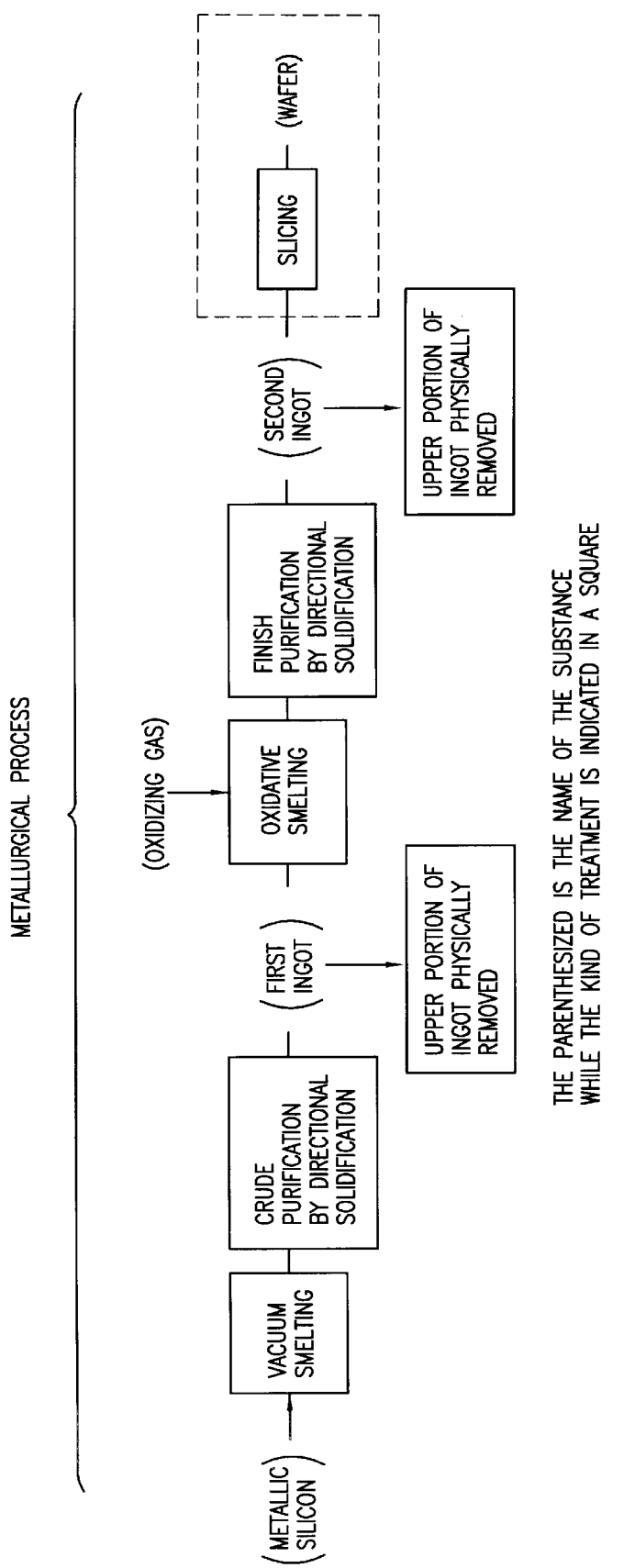
FIG. 1 is a flow chart illustrating one embodiment of a manufacturing process of polycrystalline silicon and a silicon wafer for a solar cell according to the present invention.

In FIG. 1, one embodiment of the manufacturing process of polycrystalline silicon and a silicon wafer for a solar cell according to the present invention is shown together in one flow chart (manufacture of the wafer is shown, enclosed with a dotted line).

First, metallic silicon having a relatively low purity (99.5 wt. % Si) is charged in a retaining container made of graphite or a water-cooling retaining container made of copper and then melted under vacuum. At this time, heating may be conducted making use of the methods known to date such as gas heating or electric heating, with heating by an electron gun being most preferred. Here, the metallic silicon so melted is maintained for a predetermined time (for example, 30 to 60 minutes) in the above retaining container at a temperature not lower than 1450° C. but not higher than 1900° C., whereby phosphorus and aluminum, among impurity elements contained in the melt, are removed by evaporation (vacuum smelting). It is preferred that the phosphorus concentration in the melt is 0.3 ppm or less. Then, in order to remove the impurity elements such as Fe, Al, Ti and Ca to be 100 ppm or less, the melt is cast into a first cast and is cooled upwardly from the bottom so that the moving rate of solidification interface will be 5 mm/min. As a result, an ingot in which the melt having concentrated impurity elements has been solidified last is obtained.

In succession, the upper 30% portion of the ingot having the concentrated impurity elements therein is removed by cutting. The remaining portion of the ingot is charged in a melt furnace equipped with, for example, a plasma arc, whereby the ingot is re-melted. Also in this case, the heating means is not limited to the plasma arc. The melt is heated to a temperature not lower than 1450° C. and at the same time is reacted with an oxidizing gas atmosphere, whereby boron and carbon are removed from the melt as oxides (oxidative smelting). After oxidative smelting, an argon gas or a mixed gas of argon and hydrogen is blown into the melt for a predetermined time. As a result, oxygen in the melt is deoxidized to the level not higher than 10 ppm. Incidentally, the above-described oxidative smelting may be carried out either in a vacuum chamber or in the air. The deoxidized melt is then cast into a second mold coated with a mold releasing agent, followed by directional solidification, whereby a final ingot is obtained. Impurity elements exist in the concentrated form in the upper portion of the ingot so that the portion (generally, 20% or so) is removed by cutting and the remaining portion is provided as a product of polycrystalline silicon.

Polycrystalline silicon is prepared as described above. It is only necessary to slice the above-described remaining portion by a multi-wire saw into thin plates of 100 to 450 μm thickness.

Figure 2:
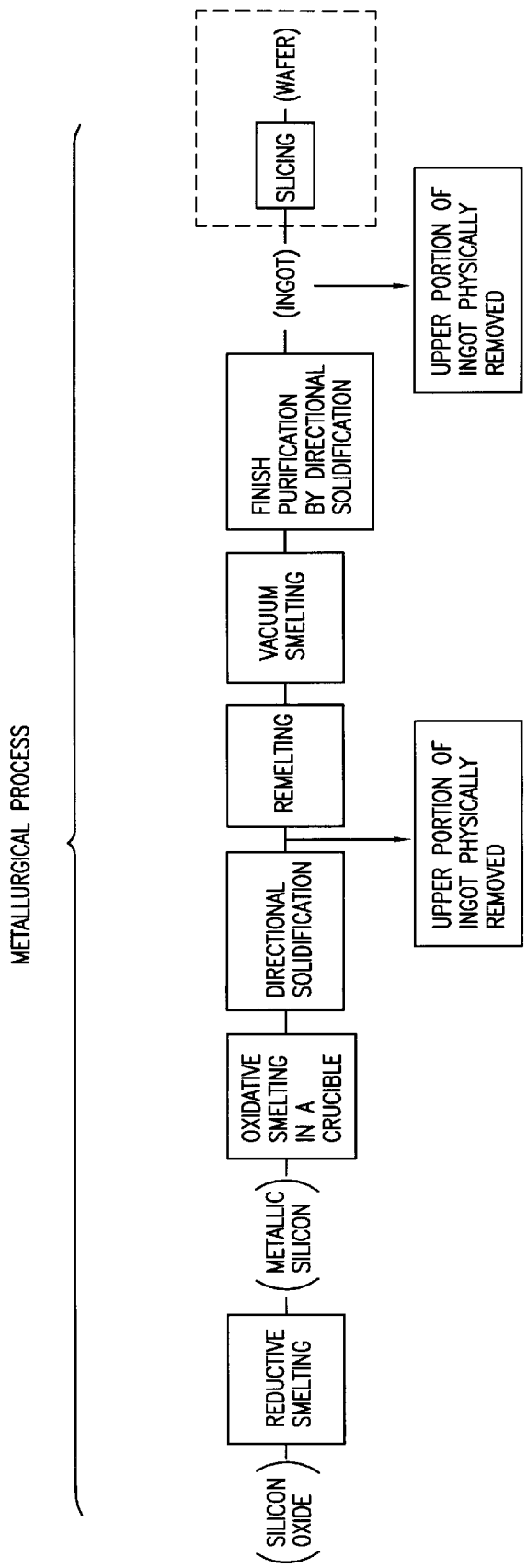
FIG. 2 is a flow chart illustrating another embodiment of the manufacturing process of polycrystalline silicon and a silicon wafer for a solar cell according to the present invention.

Metallic silicon, which is a starting material, is generally available by reductive smelting of silicon oxide so that the use of silicon oxide as a starting material is also added to the present invention. Any known methods can be employed to smelt silicon oxide into that having a purity on the same level with that of the metallic silicon used in the first step of the present invention. For example, silicon oxide is melted and reduced by using a carboneous material as a reducing agent. In the present invention, considered is a method of removing the components, which are not necessary for polycrystalline silicon or a silicon wafer for a solar cell, in advance upon obtaining metallic silicon from silicon oxide. It is a method as shown in the flow chart of FIG. 2, wherein metallic silicon which has been obtained from silicon oxide, has a relatively low purity and is under molten state is charged in a smelting container (for example, crucible) and so-called preliminary smelting is effected. Described specifically, an oxidizing gas ($H_2O$, $CO_2$ or the like) is blown into the melt in the crucible, boron and carbon are removed as oxides and then, the residue is solidified. The ingot so obtained is melted in the above-described vacuum chamber, phosphorus is removed from the melt by vacuum smelting and the residue is subjected to directional solidification, whereby an ingot of polycrystalline silicon is obtained. It is only necessary to slice the ingot into thin plates as described above to obtain a wafer. This process has a merit in that the above-described steps of "boron and carbon removal" and "solidification for the removal of impurities" of the present invention can be omitted by changing a part of ordinary metallic silicon preparation operations. As a result, this process makes it possible to omit some of the apparatuses and brings about effects for reducing energy consumption, whereby polycrystalline silicon and a silicon wafer for a solar cell on the same level with those obtained by the above-described process of the present invention are available at a lower cost. In particular, if boron and carbon removal is conducted by those who prepare metallic silicon, operations subsequent to it can be carried out more easily by the manufacturer of polycrystalline silicon or wafer.

Incidentally, the reason for setting the moving rate of the solidification interface at 5 mm/min or lower in the case of the first mold and at 2 mm/min in the case of the second mold is because moving rates higher than the above disturb sufficient concentration of impurity metal elements in the upper part of the ingot. The reason for cutting the ingot at a height not lower than 70% from the bottom of the ingot is because the target composition as polycrystalline silicon can be attained at the remaining lower portion. In the present invention, the degree of vacuum in the vacuum chamber is set at 10–3 torr or higher because it is suited for phosphorus removal by evaporation judging from the vapor pressure of phosphorus in metallic silicon.

In the present invention, the phosphorus concentration of the melt is set at 0.3 ppm or lower in order to secure stable operation of solar cells, while the boron concentration of the melt is set at 0.6 ppm or lower in order to obtain polycrystalline silicon suited for a P-type semiconductor wafer. The carbon concentration set at 10 ppm or lower makes it possible to suppress the precipitation of SiC in silicon crystals, thereby preventing the lowering in the photoelectric transfer efficiency.

Furthermore, in the present invention, a copper-made water-cooling jacket or a graphite crucible is employed as the above-described retaining container upon melting of metallic silicon and an $SiO_2$ crucible or $SiO_2$ stamped or lined crucible is used as the above-described smelting container, because silicon tends to react with other substances and when a crucible made of another substance is used, component elements of the substance is mixed in silicon. Incidentally, when boron is removed upon preparation of metallic silicon, inexpensive $Al_2O_3$, MgO, graphite or the like can be employed for the lining of the refractory, because if impurities are mixed in, they can be removed at the subsequent step. The mold releasing agent of the mold used for solidification is specified to $SiO_2$ or $Si_3N_4$ because of the same reason. Since the molten silicon expands by 10% in volume when solidified, the mold releasing agent is necessary for preventing the stress from remaining on the ingot.

Figure 3:
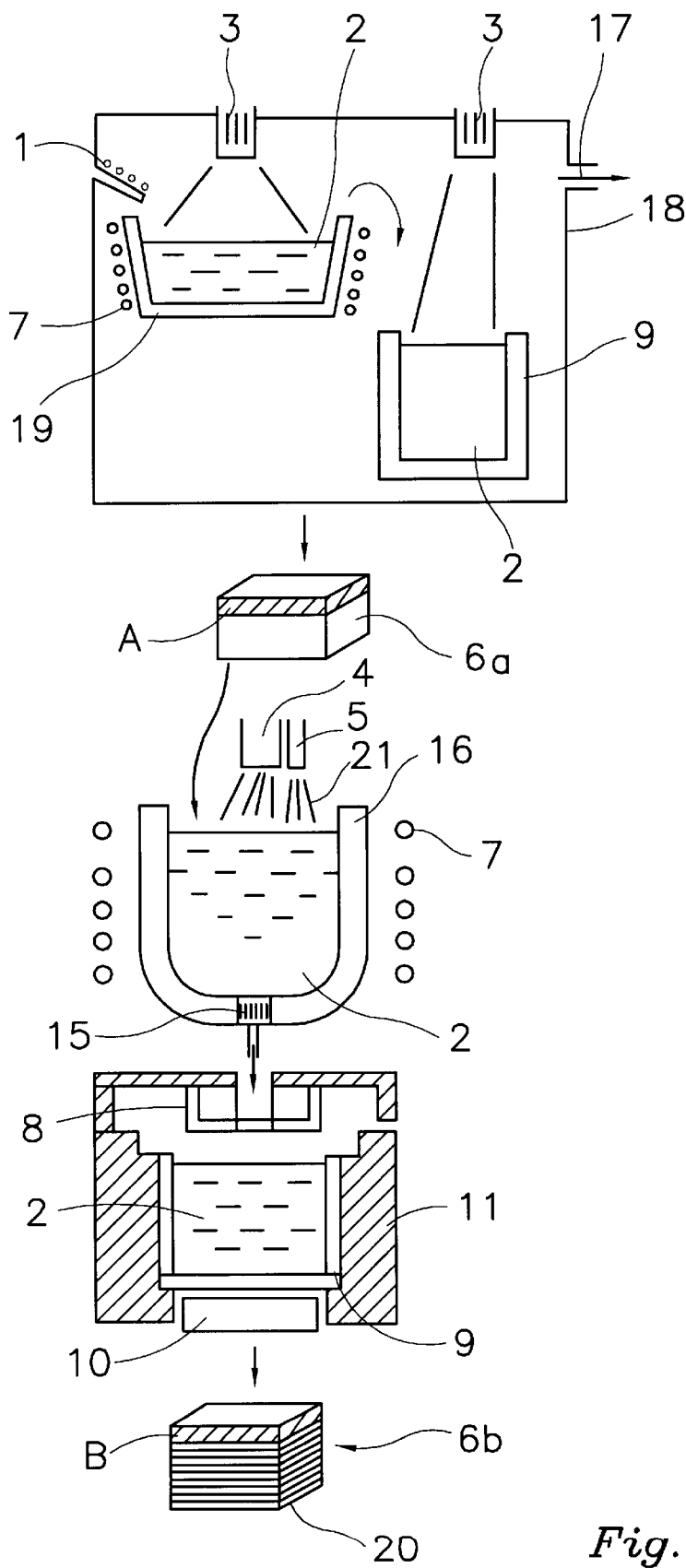
FIG. 3 is a schematic view illustrating an apparatus embodying the manufacturing process of polycrystalline silicon and a silicon wafer for a solar cell according to the present invention.

In addition, an apparatus according to the present invention is constructed so that as shown in FIG. 3, the melt 2 of metallic silicon 1 flows to the subsequent stage almost continuously except at the time of solidification. This structure makes it possible to carry out preparation smoothly and to shorten the operation time, leading to the reduction in the manufacturing cost. Besides, since the apparatuses used in the present invention are operated based on only the metallurgical process, they can be enlarged considerably and are free from generation of pollutants. Cost reduction by mass production can also be expected.

The oxidizing atmosphere for the removal of boron and carbon from the melt 2 is not required to have high acidifying power. Preferred as the oxidizing gas is $H_2O$ or $CO_2$. When acidifying power is high, an $SiO_2$ film is formed on the surface of the melt, which hinders the removal of boron and $CO_2$. In such a case, injection of arc from a plasma torch 4 or DC arc source is necessary for the removal of such a film. The above-described oxidizing gas may be blown directly into the melt. The material of a nozzle 5 from which the oxidizing gas is blown is limited to graphite or $SiO_2$, because other materials contaminate the melt 2. Incidentally, as a cutting machine (not illustrated) for cutting the ingot 6a released from the second mold 9 into thin plates, a known multi-wire saw or multi-blade saw can be used without problems. The reason why the thickness of the thin plate is set at 100 to 450 μm is because the plate is too weak at the thickness less than 100 μm, while it has lowered photoelectric transfer efficiency at the thickness exceeding 450 μm.

In the apparatus according to the present invention, a particular consideration is taken for the structure of the mold 9 in which solidification is carried out. Described specifically, as shown in FIG. 3, the mold is shaped into a so-called washball having a diameter W:height H ratio of 0.5 or greater. In addition, it is constructed to have a heat insulating material 11 as a side wall, a water-cooled jacket 10 as a bottom and a heating source 8 disposed in the upper part of the mold so that the moving rate of the solidification interface can be regulated.

In the present invention, it is also possible to carry out the solidification operations (solidification—re-melting) in the first mold and second mold in repetition. Alternatively, after a plurality of molds are provided and the above-described retaining container or smelting container is enlarged, the melt may be poured from the enlarged container in portions to the plural molds. Moreover, it is not necessary to effect the steps A, B, C, D and E in this order except that the steps D and E come last.

EXAMPLE 1

As shown in FIG. 3, an electron gun 3 of 300 KW in output was installed on the upper part of a vacuum chamber 18. Metallic silicon 1 was fed to a retaining container 19 (which is also called a melting furnace) made of graphite at 10 kg/hour and was melted using heating means 7. At this time, the degree of vacuum in the vacuum chamber 18 was $10^{-5}$ torr. From the melt 2, a portion of phosphorus and aluminum elements were evaporated and removed 17. The remaining melt 2 was then cast into a water-cooling type copper-made mold 9. While the surface of the melt was exposed to electron beam 3 to maintain the molten state, the melt was solidified from the bottom at a solidification interface moving rate of 1 mm/min, whereby 50 kg of an ingot 6a were obtained. The upper 20% portion of the ingot 6a (the portion A) was removed by cutting to obtain an ingot having a chemical composition as shown in Table 1.

TABLE 1

|  | B | P | Fe | Al | Ti | La | C | O |
|---|---|---|---|---|---|---|---|---|
| | | | | | | | (Unit: ppm) | |
| Metallic silicon | 7 | 23 | 980 | 860 | 180 | 950 | ~5000 | — |
| Ingot after crude purification | 7 | <0.1 | 10 | 8.5 | 2 | 10 | 35 | — |
| Wafer | 0.1 | <0.1 | <0.1 | <0.1 | <0.1 | <0.1 | 3.5 | 5.7 |

The remaining portion of the ingot 6a was then melted in a silica crucible (smelting container) 16 above which a plasma torch 4 of 100 KW in output was disposed. The melt was kept at a temperature of 1600° C. and a mixed gas 21 of argon and water vapor, said gas containing 15 vol. % of water vapor, was sprayed to the surface of the melt. At this time, a sample was taken from the melt 2 and its specific resistivity was measured. About two hours later, the specific resistivity became 1 ohm.cm so that the mixed gas 21 was changed to an argon gas and deoxidization was effected for 30 minutes. The melt was then poured into a second mold which was made of graphite and coated with $Si_3N_4$ as a mold release agent and was solidified by cooling upwardly from the bottom under an argon gas atmosphere, whereby an ingot was obtained. At this time, a graphite heater 8 was disposed in the upper part of the mold 9 by which the surface of the melt was heated. As a result, the moving rate of the solidification interface was 0.7 mm/min.

After the completion of the solidification, the upper 30% of the ingot 6b so obtained (the portion B) was removed by cutting and the remaining portion of the ingot was provided as a product of polycrystalline silicon. The product so obtained was sliced into thin plates having a thickness of 350 μm, by a multi-wire saw, whereby 300 silicon wafers 20 for solar cells, each wafer having a size of 15 cm×15 cm, were manufactured. These wafers each had a specific resistivity of 1.2 ohm.cm, had a minority carrier whose life time was 12 μsec and, had a photoelectric transfer efficiency of 13.8%. Its chemical composition is as shown in Table 1.

EXAMPLE 2

In a similar manner to Example 1, an ingot 6a was obtained from the first mold. The upper 70% portion of the ingot was melted in a silica crucible (smelting container) 16 above which a plasma torch 4 of 100 KW in output was disposed. Into the melt 2 maintained at 1600° C., a mixed gas 21 of argon and water vapor, said gas containing 15 vol. % of water vapor, was blown at a rate of 10 liter/min through a porous plug 15 disposed at the bottom of the crucible 16, whereby boron and carbon were removed from the melt. The residue was subjected to deoxidization, directional solidification and removal by cutting, whereby a product of polycrystalline silicon was obtained. The product was sliced in a similar manner to Example 1, whereby silicon wafers for solar cells were manufactured.

The size, number and performance of the wafer so obtained were much the same with those of the wafer obtained in Example 1.

EXAMPLE 3

Figure 4:
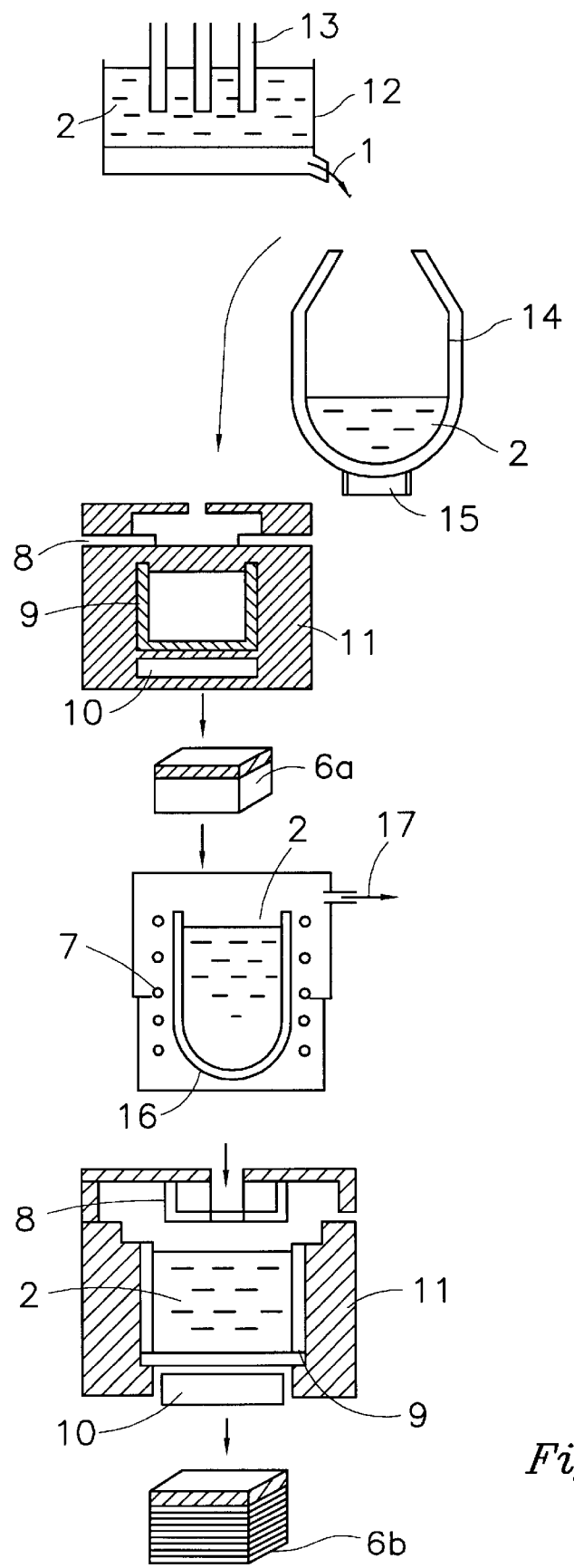
FIG. 4 illustrates another apparatus embodying the manufacturing process of polycrystalline silicon and a silicon wafer for a solar cell according to the present invention.
Figure 5:
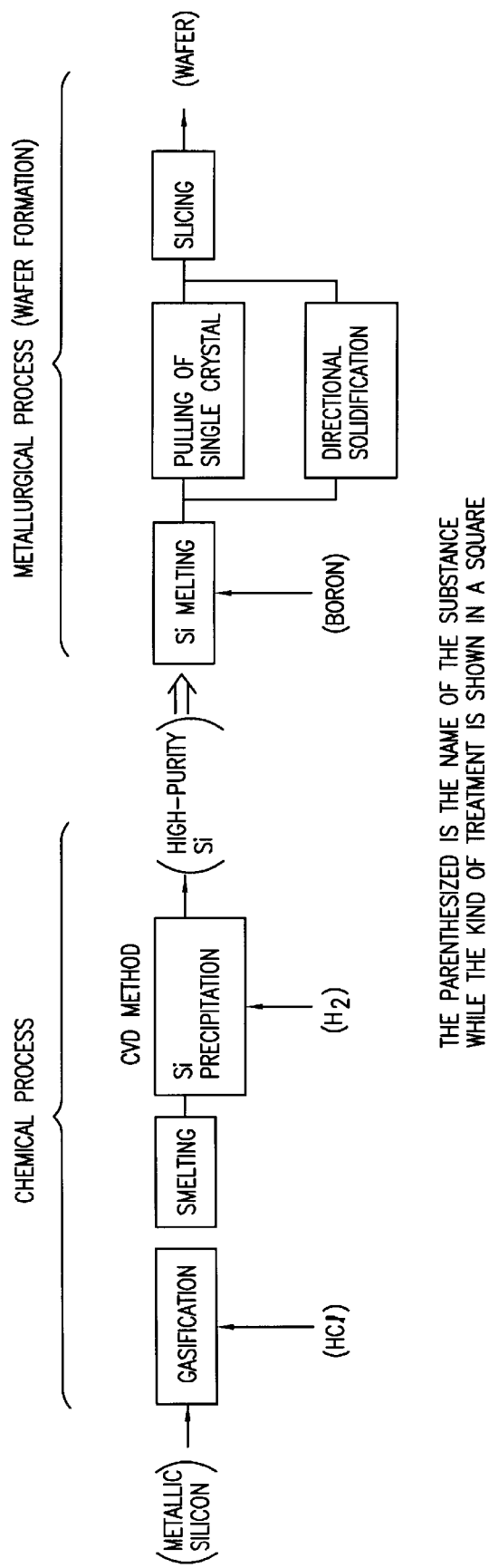
FIG. 5 is a flow chart illustrating the conventional process for manufacturing a silicon wafer for a solar cell.

Using silicon oxide as a starting material, an arc electric furnace 12 as shown in FIG. 4 and a carbonaceous reducing agent, melting and reduction were carried out, whereby molten metallic silicon having a chemical composition as shown in Table 2 was manufacture. In a crucible 14 equipped with a porous plug 15 at the bottom thereof and lined with a siliceous refractory, 50 kg of the metallic silicon 1 were charged. Then, a mixed gas of argon and water vapor, said gas containing 20 vol % of water vapor, was blown into the melt for 30 minutes through the porous plug 15. The remaining melt 2 was heated to 1650° C. by the oxidizing heat of silicon and boron- and carbon-removal reaction occurred. The melt 2 was cast into a first mold which had an SiC-made heater disposed in the upper part of the mold and had a bottom cooling system, and was solidified by cooling at a moving rate of the solidification surface at 1.5 mm/min. The lower 80% portion of the ingot so obtained was melted in succession in the retaining container disposed in the above-described vacuum chamber, followed by dephosphorization and deoxidization. The resulting melt was poured into the second mold, whereby directional solidification was effected. The upper 30% portion of the ingot 6 so obtained was removed by cutting and the remaining portion was provided as a product of polycrystalline silicon. The product was sliced by a multi-blade saw into thin plates of the above size, whereby 300 polycrystalline silicon wafers for solar cells were obtained. The wafers each had a specific resistivity of 0.9 ohm.cm, had a minority carrier whose life time was 10 μsec and had a photoelectric transfer efficiency of 13.5%. It had a chemical composition as shown in Table 2.

TABLE 2

| | B | P | Fe | Al | Ti | Ca | C | O |
|---|---|---|---|---|---|---|---|---|
| | | | | | | | (Unit: ppm) | |
| Metallic silicon | 7 | 25 | 1010 | 800 | 180 | 950 | ~5000 | — |
| Ingot after smelting in crucible | 7 | 23 | 10 | 25 | 3 | 13 | 6 | 40 |
| Wafer | 0.1 | <0.1 | <0.1 | <0.1 | <0.1 | <0.1 | 4 | 1 |

In conclusion, the advantages of the manufacturing process and apparatus of polycrystalline silicon and manufacturing process of polycrystalline silicon wafers for solar cells according to the present invention will be summarized below compared with the conventional ones.

The processes for manufacturing polycrystalline silicon and polycrystalline silicon wafers for solar cells according to the present invention are free from the source-wise problem (in other words, shortage in raw materials does not occur), do not by-produce pollutants and are essentially suited to the scale up of the equipment and mass production because of a metallurgical technique employed. It is therefore possible to supply wafers stably even if the demand for solar cells will increase by several hundred times in future. In addition, during the manufacture of wafers from high-purity silicon in the mass form, about 20 wt. % of losses and inferior products appear as a result of pulverization or the like. Continuous and consistent manufacture from silicon to wafers according to the present invention, on the other hand, reduces losses, whereby electricity and energy can be used effectively. The price of the silicon wafer available in the enforcement of the present invention can be reduced to half of that of the conventional product, which makes it possible to allow the solar cell to function economically as an electricity generating apparatus.

What is claimed is:

1. A process for manufacturing polycrystalline silicon from metallic silicon, comprising the steps of:

melting metallic silicon under a vacuum to remove the phosphorus contained in said metallic silicon by evaporation, thereby generating a residue containing impurity elements; carrying out directional solidification by solidifying said residue upwardly from a lower portion of said residue to an upper portion of said residue thereby obtaining a first ingot, wherein said first ingot contains an impurity concentrated portion;

physically removing said impurity concentrated portion of said first ingot, leaving a remaining portion of said first ingot having a reduced impurity concentration;

re-melting said remaining portion of said first ingot, thereby forming a melt; removing boron and carbon from said melt by oxidizing said melt in an oxidizing atmosphere, and in succession, blowing argon gas or a mixed gas of argon and hydrogen into said melt for deoxidization thereby forming a deoxidized melt;

casting said deoxidized melt in a mold;

subjecting the resulting deoxidized casting to directional solidification wherein said deoxidized casting is solidified upwardly from a lower portion of said deoxidized casting to produce a second ingot wherein said second ingot contains a second impurity concentration portion; and physically removing said second impurity concentrated portion of said second ingot to obtain the polycrystalline silicon.

2. A process according to claim 1, wherein said metallic silicon is obtained by reductive smelting of silicon oxide.

3. A process for the production of polycrystalline silicon, which comprises:

transferring a melt of metallic silicon, obtained by reductive smelting of silicon oxide, into a crucible, removing boron and carbon by oxidizing said melt in an oxidizing atmosphere, subjecting said melt to directional solidification to obtain a first ingot, said first ingot having a first impurity concentrated portion, said directional solidification comprising solidifying said molten metallic silicon upwardly from a lower portion of said melt to an upper portion of said melt;

physically removing said first impurity concentrated portion of said first ingot, leaving a remaining portion of said first ingot having a reduced impurity concentration;

melting said remaining portion of said first ingot under a vacuum thereby forming a re-melt and removing phosphorus from said re-melt;

casting said re-melt in a mold, forming a re-melt casting;

subjecting said re-melt casting to directional solidification wherein said re-melt casting is solidified upwardly from a lower portion of said re-melt casting to produce a second ingot wherein said second ingot contains a second impurity concentrated portion; and physically removing said second impurity concentrated portion of said second ingot to obtain the polycrystalline silicon.

4. The process according to claim 1 or 3, wherein said oxidizing atmosphere is formed from a gas selected from the group consisting of $H_2O$, $CO_2$, and $O_2$ gas, wherein the amount of said gas is controlled such that the interface between said melt and said gas is covered with silicon oxide.

5. The process according to claim 4, wherein said silicon oxide is removed by locally heating said silicon oxide by plasma arc.

6. The process according to claim 1 or 3, wherein a gas is blown into the melt and said gas being selected from the group consisting of $H_2O$, $CO_2$, and $O_2$ gas.

7. The process according to claim 1 or 3, wherein a mold releasing agent is used, said mold releasing agent being selected from the group consisting of $SiO_2$ and $Si_3N_4$.

8. The process according to claim 1 or 3, wherein a solidification interface moving rate is set at 5 mm/min or less for obtaining the first ingot, and a solidification interface moving rate for obtaining the second ingot is set at 2 mm/min or less.

9. The process according to claim 1 or 3, wherein said first ingot is cut such that the impurity concentrated portion of about 30% or less of the height of said first ingot is removed.

10. The process according to claim 1 or 3, wherein said phosphorus concentration of the polycrystalline silicon is 0.3 ppm or less.

11. The process according to claim 1 or 3, wherein said boron concentration of the polycrystalline silicon is 0.6 ppm or less.

12. The process according to of claim 1 or 3, wherein said carbon concentration of the polycrystalline silicon is 10 ppm or less.

13. An apparatus for manufacturing polycrystalline silicon, which comprises a retaining container for retaining metallic silicon, heating means for heating said retaining container, thereby maintaining said metallic silicon in a molten state; a first mold into which said metallic silicon in said molten state is cast from said retaining container; a vacuum chamber for removing phosphorus from said metallic silicon by evaporation, wherein said vacuum chamber surrounding said retaining container and said first mold; means for effecting directional solidification of cast metallic silicon, wherein a first cast silicon ingot is formed, said first cast silicon ingot having a first impurity concentrated portion; means for removing said first impurity concentrated portion of said first cast silicon ingot, leaving a remaining portion of said first cast silicon ingot; a smelting container positioned to receive said remaining portion of said first cast silicon ingot, said smelting container having a re-melting means for controllably heating at least a portion of said remaining portion of said first cast silicon ingot, thereby forming a re-melt, said smelting container having a spraying means for spraying a gas from a gas source on said re-melt, said gas source comprising a gas selected from the group consisting of an oxidizing gas, a hydrogen gas and a mixed gas of hydrogen and argon, and a second mold positioned to receive said re-melt, means for effecting directional solidification of said re-melt for forming said re-melt into a second cast silicon ingot having a second impurity concentrated portion; means for removing said second impurity concentrated portion of said second cast silicon ingot.

14. An apparatus according to claim 13, wherein the degree of vacuum in said vacuum chamber is set at about $10^{-3}$ torr or higher.

15. An apparatus according to claim 13, wherein said retaining container is a water cooled copper crucible or a graphite crucible; and the smelting container is selected from the group consisting of a crucible made of $SiO_2$, $SiO_2$ stamped crucible, and a $SiO_2$ lined crucible.

16. An apparatus according to claim 13, wherein said heating means is an electron gun.

17. An apparatus according to claim 13, wherein said re-melting means is selected from the group consisting of a plasma torch and a DC arc source.

18. An apparatus according to claim 13, wherein said first and second molds have side walls formed of a heat insulating material and have a bottom formed of a water-cooled jacket and wherein a heating source for heating the melt is disposed above the casts.

19. An apparatus according to claim 13, wherein said first cast silicon ingot and said second cast silicon ingot have a diameter W and a height H, and the ratio of W/H is set at 0.5 or more.

20. A process for the production of a silicon wafer for a solar cell, which comprises slicing an ingot of polycrystalline silicon obtained in the process according to claim 1 or 3 into thin plates having a thickness of about 100 to 450 $\mu$m.

* * * * *